US007898498B2

(12) United States Patent
Higashi et al.

(10) Patent No.: US 7,898,498 B2
(45) Date of Patent: Mar. 1, 2011

(54) TRANSDUCER FOR HIGH-FREQUENCY ANTENNA COUPLING AND RELATED APPARATUS AND METHOD

(75) Inventors: Robert Higashi, Shorewood, MN (US); Fouad Nusseibeh, Champlin, MN (US)

(73) Assignee: Honeywell International Inc., Morristown, NJ (US)

( * ) Notice: Subject to any disclaimer, the term of this patent is extended or adjusted under 35 U.S.C. 154(b) by 358 days.

(21) Appl. No.: 12/052,419

(22) Filed: Mar. 20, 2008

(65) Prior Publication Data

US 2009/0237320 A1 Sep. 24, 2009

(51) Int. Cl.
*H01Q 1/36* (2006.01)
(52) U.S. Cl. .................................... 343/895; 250/338.4
(58) Field of Classification Search .............. 250/338.1, 250/338.4; 257/57; 343/895, 700 MS, 702, 343/850
See application file for complete search history.

(56) References Cited

U.S. PATENT DOCUMENTS

| 3,446,975 | A | * | 5/1969 | De Vries et al. ......... 250/214.1 |
| 4,096,456 | A | * | 6/1978 | Coussot et al. ............. 333/196 |
| 5,146,234 | A | * | 9/1992 | Lalezari ..................... 343/895 |
| 5,164,738 | A | * | 11/1992 | Walter et al. ............... 343/789 |
| 5,220,188 | A | | 6/1993 | Higashi et al. |
| 5,220,189 | A | | 6/1993 | Higashi et al. |
| 5,449,910 | A | | 9/1995 | Wood et al. |
| 5,469,170 | A | * | 11/1995 | Mariani ....................... 342/51 |
| 5,534,111 | A | | 7/1996 | Hocker et al. |
| 5,895,233 | A | | 4/1999 | Higashi et al. |
| 6,036,872 | A | | 3/2000 | Wood et al. |
| 6,249,255 | B1 | * | 6/2001 | Eggleston ................... 343/702 |
| 6,316,770 | B1 | | 11/2001 | Ouvrier-Buffet et al. |
| 6,329,655 | B1 | | 12/2001 | Jack et al. |
| 6,842,158 | B2 | * | 1/2005 | Jo et al. ...................... 343/895 |
| 2004/0140429 | A1 | | 7/2004 | Jack et al. |
| 2006/0081781 | A1 | | 4/2006 | Bluzer |
| 2007/0146720 | A1 | | 6/2007 | Cox et al. |
| 2007/0278407 | A1 | | 12/2007 | Wood et al. |

OTHER PUBLICATIONS

E. N. Grossman, et al., "Terahertz Active Direct Detection Imagers", Quantum Electrical Metrology Division, National Institute of Standards and Technology, Proceedings of SPIE, vol. 5411, Sep. 2004, p. 68-77.

* cited by examiner

*Primary Examiner*—Tho G Phan
(74) *Attorney, Agent, or Firm*—Munck Carter, LLP

(57) ABSTRACT

An apparatus includes an antenna having multiple conductive portions. The apparatus also includes a transducer electrically coupling the conductive portions of the antenna. The transducer includes a first conductive path electrically coupled to one of the conductive portions and a second conductive path electrically coupled to the first conductive path and to another of the conductive portions. The first and second conductive paths at least partially overlap along at least a substantial portion of their lengths, where the overlap occurs in a direction perpendicular to a plane of the antenna portions.

20 Claims, 12 Drawing Sheets

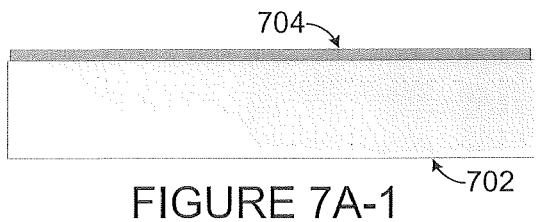
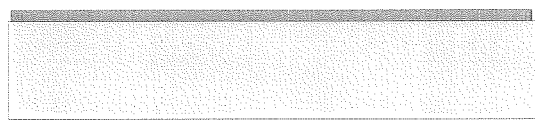
FIGURE 7A-1                      FIGURE 7A-2
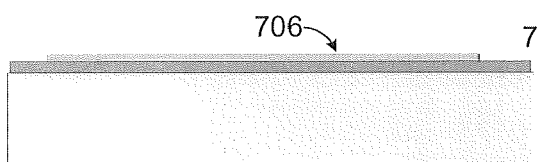
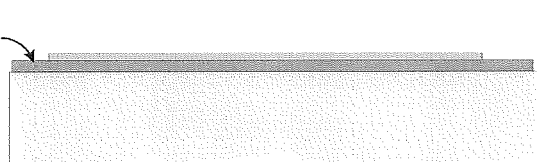
FIGURE 7B-1                      FIGURE 7B-2
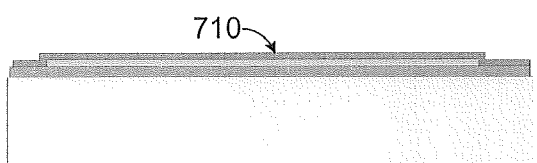
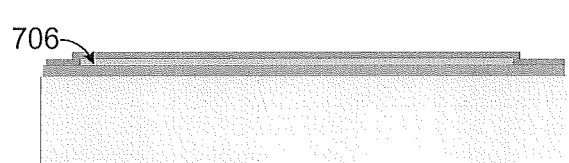
FIGURE 7C-1                      FIGURE 7C-2
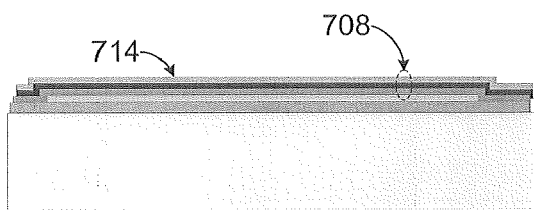
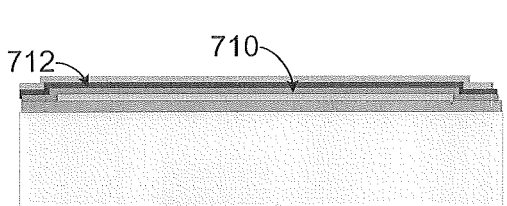
FIGURE 7D-1                      FIGURE 7D-2

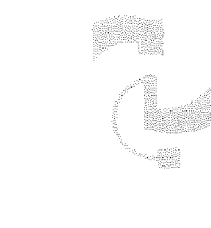
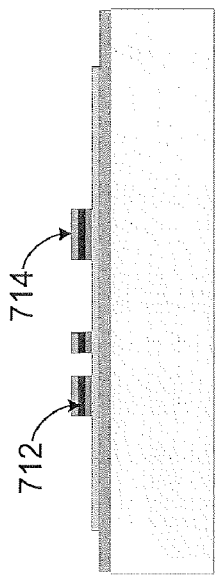
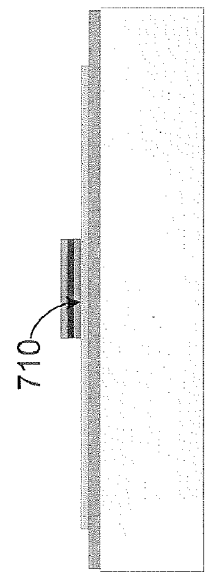
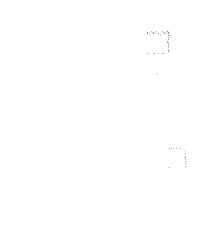
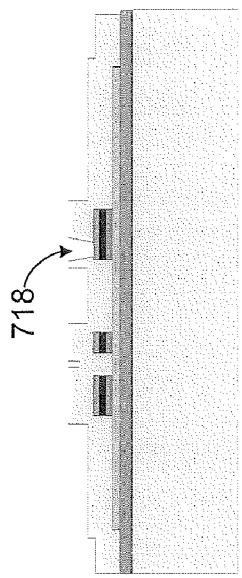
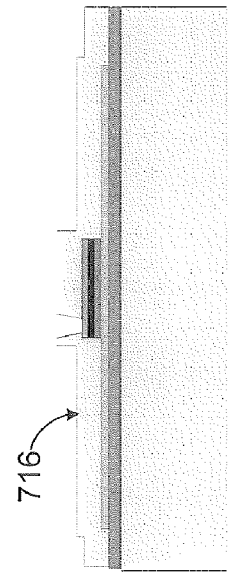
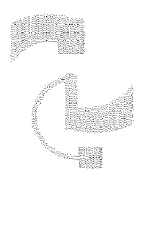
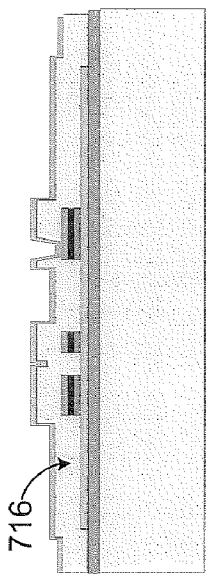
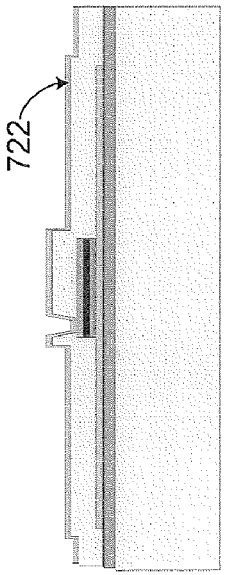

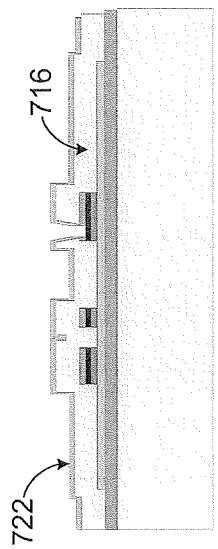
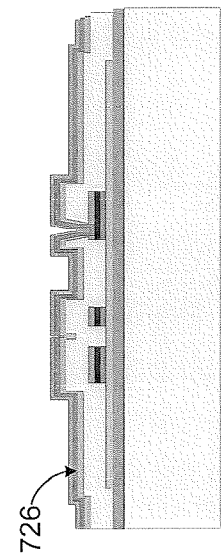
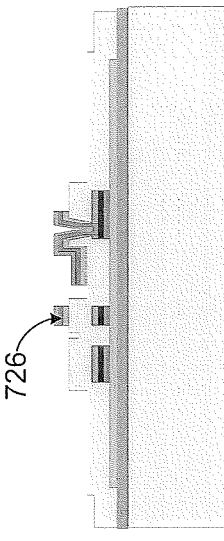
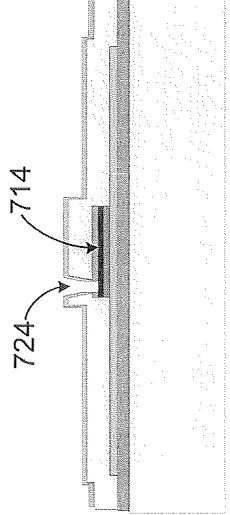
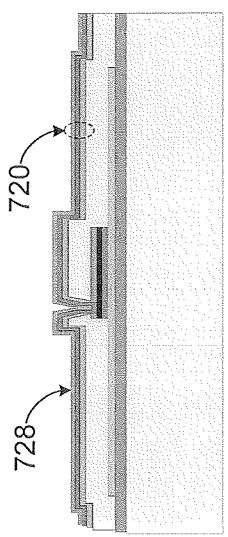
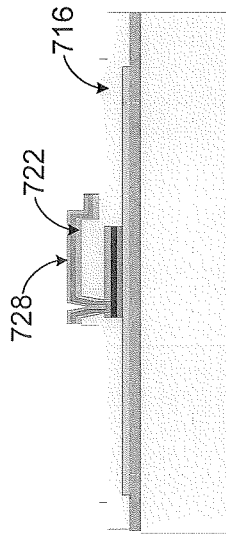

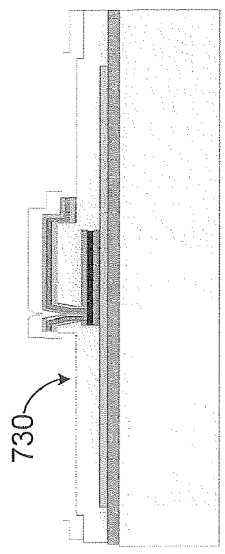
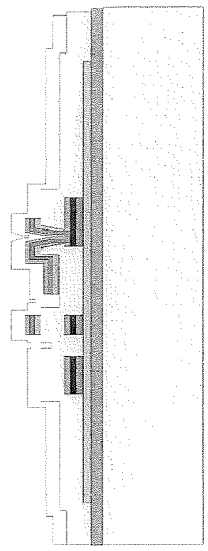
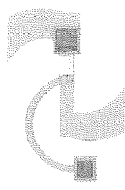
FIGURE 7K-1 FIGURE 7K-2 FIGURE 7K-3
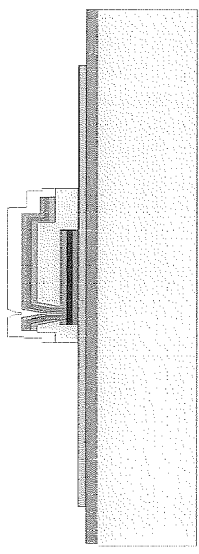
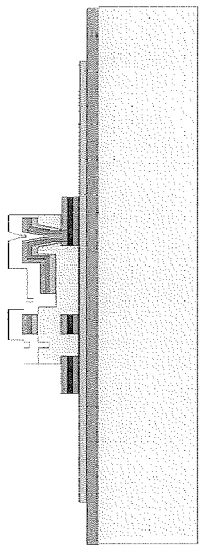
FIGURE 7L-1 FIGURE 7L-2 FIGURE 7L-3
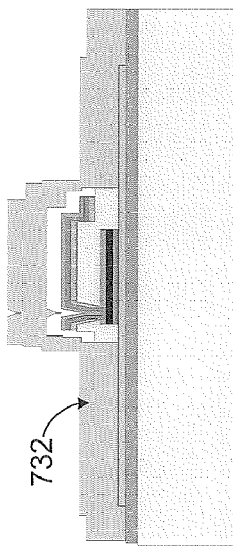
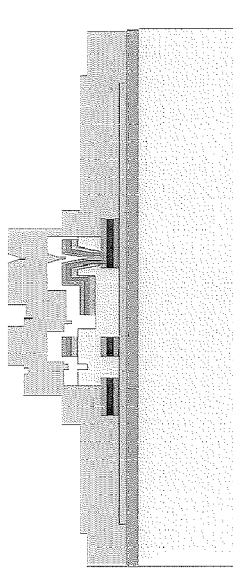
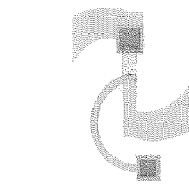
FIGURE 7M-1 FIGURE 7M-2 FIGURE 7M-3

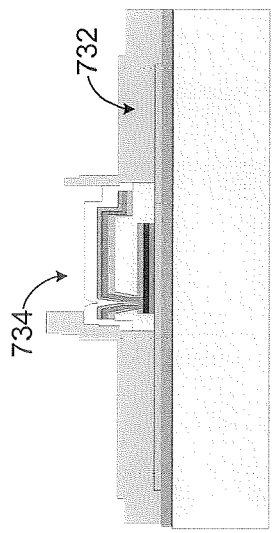
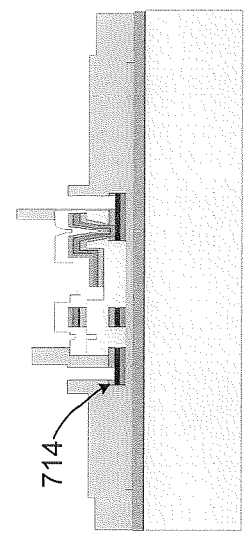
FIGURE 7N-1
FIGURE 7N-2
FIGURE 7N-3
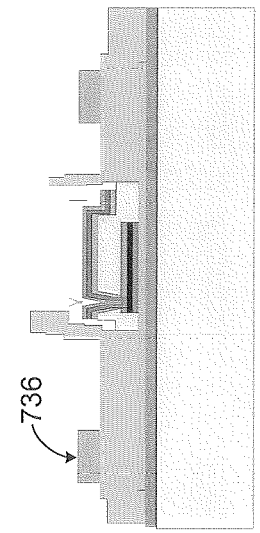
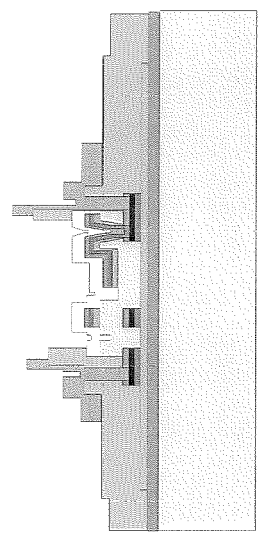
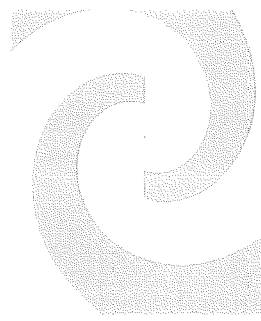
FIGURE 7O-1
FIGURE 7O-2
FIGURE 7O-3
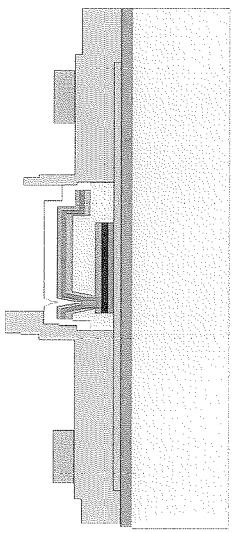
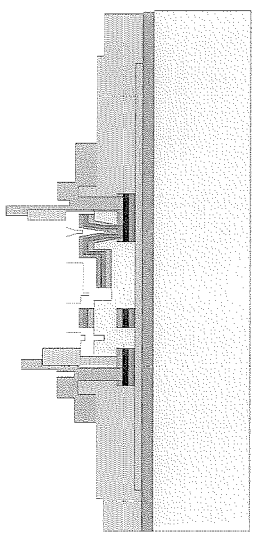
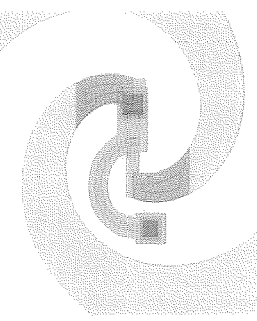
FIGURE 7P-1
FIGURE 7P-2
FIGURE 7P-3

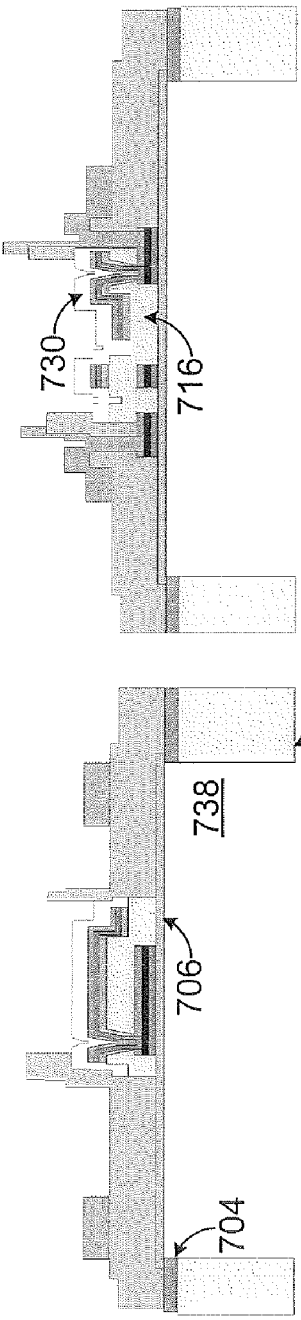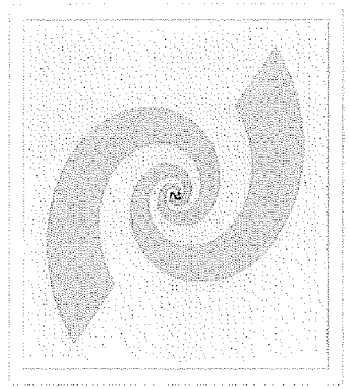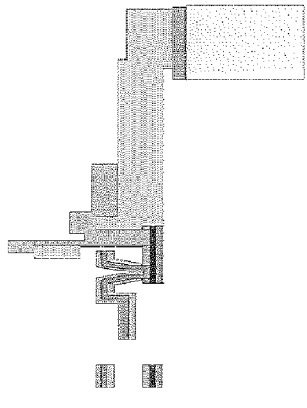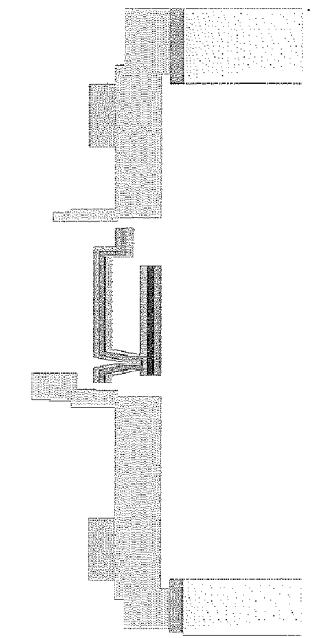

TRANSDUCER FOR HIGH-FREQUENCY ANTENNA COUPLING AND RELATED APPARATUS AND METHOD

GOVERNMENT RIGHTS

The U.S. Government has a paid-up license in this invention and the right in limited circumstances to require the patent owner to license others on reasonable terms as provided for by terms from the Defense Advanced Research Projects Agency (DARPA).

TECHNICAL FIELD

This disclosure relates generally to wireless devices and more specifically to a transducer for high-frequency antenna coupling and related apparatus and method.

BACKGROUND

Antennas routinely include multiple antenna portions that are coupled together by transducers. The antenna portions generally collect energy associated with radiation from wireless signals received by an antenna. The antenna portions produce an associated current, and the transducer converts that current into a direct current (DC) voltage. The DC voltage can be measured or otherwise used by external components to perform various functions.

Conventional transducers typically include planar resistor loops, an example of which is shown in FIG. 1. In FIG. 1, a resistor loop 100 includes two generally co-planar conductive paths 102-104, each of which is typically coupled to a different portion of an antenna. The conductive paths 102-104 have a small overlapping area 106, where the different conductive paths 102-104 are electrically coupled to each other.

A problem with conventional resistor loop transducers (such as that shown in FIG. 1) is that they can suffer from significant inductive impedances at higher frequencies. This can be a problem, for example, at frequencies of several hundred gigahertz up into the terahertz range. The inductive impedance created in a conventional resistor loop transducer can reduce the efficiency of the transducer, negatively impacting operation of the antenna.

SUMMARY

This disclosure provides a transducer for high-frequency antenna coupling and related apparatus and method.

In a first embodiment, an apparatus includes an antenna having multiple conductive portions. The apparatus also includes a transducer electrically coupling the conductive portions of the antenna. The transducer includes a first conductive path electrically coupled to one of the conductive portions and a second conductive path electrically coupled to the first conductive path and to another of the conductive portions. The first and second conductive paths at least partially overlap along at least a substantial portion of their lengths, where the overlap occurs in a direction perpendicular to a plane of the antenna portions.

In a second embodiment, a method includes forming a first conductive path over a semiconductor substrate. The method also includes forming a second conductive path electrically coupled to the first conductive path. In addition, the method includes forming multiple antenna portions. The first conductive path is coupled to one of the antenna portions, and the second conductive path is coupled to another of the antenna portions. The first and second conductive paths at least partially overlap along at least a substantial portion of their lengths, where the overlap occurs in a direction perpendicular to a plane of the antenna portions.

In a third embodiment, a system includes an antenna configured to receive wireless signals and to generate voltages based on the wireless signals. The system also includes a processing circuit configured to process the voltages or information associated with the voltages. The antenna includes multiple conductive portions and a transducer electrically coupling the conductive portions of the antenna. The transducer includes a first conductive path electrically coupled to one of the conductive portions and a second conductive path electrically coupled to the first conductive path and to another of the conductive portions. The first and second conductive paths at least partially overlap along at least a substantial portion of their lengths, where the overlap occurs in a direction perpendicular to a plane of the antenna portions.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIGS. 4A-1 through 4E-2 illustrate example antennas having overlaid resistor loop transducers according to this disclosure;

FIGS. 7A-1 through 7R-3 illustrate an example technique for forming an antenna with an overlaid resistor loop transducer according to this disclosure.

DETAILED DESCRIPTION

FIGS. 2 through 8, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 2:
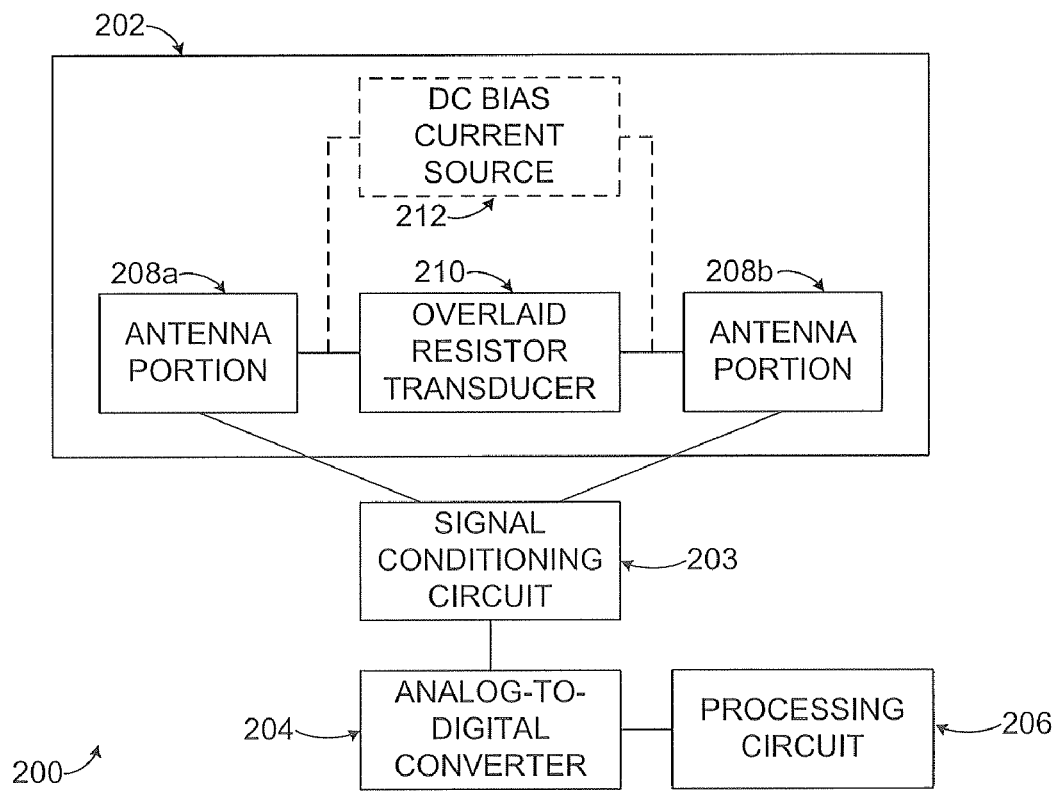
FIG. 2 illustrates an example system including an antenna with an overlaid resistor loop transducer according to this disclosure.

FIG. 2 illustrates an example system 200 including an antenna with an overlaid resistor loop transducer according to this disclosure. The embodiment of the system 200 shown in FIG. 2 is for illustration only. Other embodiments of the system 200 could be used without departing from the scope of this disclosure.

As shown in FIG. 2, the system 200 includes an antenna 202, a signal conditioning circuit 203, an analog-to-digital converter 204, and a processing circuit 206. The antenna 202 represents any suitable structure that can collect energy associated with radiation from received wireless signals. In this example, the antenna 202 includes multiple antenna portions 208a-208b, which represent conductive portions of the antenna 202 that are able to collect the energy from the wireless signals. The collected energy creates a voltage across the antenna portions 200a-208b of the same frequency as the received radiation. Each of the antenna portions 208a-208b could have any suitable size, shape, and arrangement. Also, any suitable number of antenna portions could be used in the antenna 202.

Figure 3:
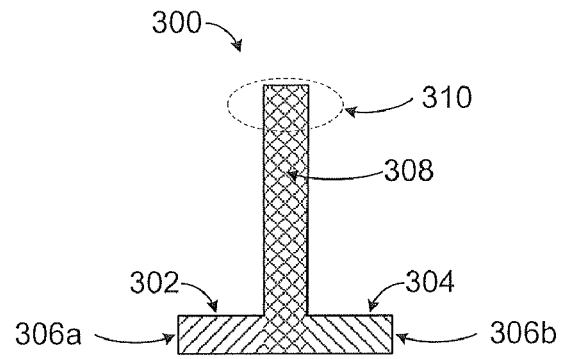
FIG. 3 illustrates an example overlaid resistor loop transducer in an antenna according to this disclosure.

The antenna portions 208a-208b are electrically coupled to an overlaid resistor transducer 210, generating an alternating current through the transducer 210. The energy collected by the antenna portions 208a-208b therefore generates ohmic heating in the overlaid resistor transducer 210. Because of its thermal isolation, this heats the overlaid resistor transducer 210, which generates a direct current (DC) voltage by the overlaid resistor transducer 210. As noted above, conventional resistor loop transducers can suffer from excessive inductive impedances, which can adversely affect the operation of an antenna by reducing the generation of ohmic heating in the conventional resistor loop transducers. As described in more detail below, the overlaid resistor transducer 210 includes multiple conductive paths, and the conductive paths are overlaid partially or totally along at least a substantial portion of their length. The actual percentage of the overlap could vary, such as between 50 and 95 percent (or any other suitable value). This helps to provide the desired resistance in the overlaid resistor transducer 210 without producing an excessive inductive impedance. One example of an overlaid resistor transducer is shown in FIG. 3, which is described below.

Example embodiments of antennas with overlaid resistor transducers are shown in FIGS. 4A-1 through 4E-2, which are described below. In particular, these figures illustrate example embodiments of the antenna portions 208a-208b and example embodiments of the overlaid resistor transducer 210.

The DC voltage created by the overlaid resistor transducer 210 is received at the signal conditioning circuit 203, which conditions the voltage for use by the analog-to-digital converter 204. The signal conditioning circuit 203 could perform any suitable operation(s) on the voltage, such as by amplifying the voltage. The signal conditioning circuit 203 includes any suitable structure(s) for conditioning a signal. The analog-to-digital converter 204 receives and converts the conditioned voltage into a digital value. As the voltage produced by the overlaid resistor transducer 210 varies, the digital values produced by the analog-to-digital converter 204 also vary. The analog-to-digital converter 204 represents any suitable structure for converting analog voltages into digital values.

The processing circuit 206 generally represents any suitable structure(s) that can receive and process the digital values from the analog-to-digital converter 204. The makeup, arrangement, and operation of the processing circuit 206 may vary depending on the application (examples of which are provided below). The processing circuit 206 includes any suitable structure(s) for collecting or using voltages generated by the antenna 202 (or information associated with those voltages). The processing circuit 206 could, for example, represent a microprocessor, a microcontroller, a digital signal processor (DSP), an application specific integrated circuit (ASIC), or other or additional components.

The system 200 could generally be used in a wide variety of applications, such as those applications requiring the use of wireless signals having frequencies of several hundred gigahertz up into the terahertz range. The wireless signals could, for instance, be between 500 gigahertz and 3.0 terahertz. As particular examples, the system 200 could be used in weapon/object detection security systems and in chemical detection systems.

In a weapon/object detection security system, multiple antennas 202 could collect energy associated with the radiation from wireless signals reflected from or transmitted through people. Due to the high frequency of the signals, the signals may penetrate people's clothing. Among other things, this may allow weapons or other objects under the people's clothes to be identified more easily. In these types of systems, the antennas 202 could collect energy from the high-frequency signals, and the processing circuit 206 could collect information and generate images for presentation to security personnel or other personnel.

In a chemical detection system, one or more antennas 202 could collect energy associated with the radiation from wireless signals reflected from or transmitted through substances being examined. In these types of systems, the antennas 202 could collect energy from the signals, and the processing circuit 206 could collect the information and determine the absorption bands of individual materials within the substances being examined. Among other things, this may allow dangerous, hazardous, or other substances to be identified.

In these and other implementations, the antenna portions 208a-208b may generate voltages based on the energy associated with radiation from received wireless signals. Those voltages create currents that pass through the overlaid resistor transducer 210, which generates heat. The overlaid resistor transducer 210 is therefore a thermally-isolated microstructure representing a thermocouple, which generates a voltage as a result of the temperature caused by the current. This voltage can be used by the other components in the system 200 to perform various functions.

The antenna 202 could optionally include a DC bias current source 212. The DC bias current source 212 generates a known bias current that is applied across the overlaid resistor transducer 210. This allows the processing circuit 206 to measure the resistance of the overlaid resistor transducer 210, which can vary slightly over time. The processing circuit 206 could then use the measured resistance of the overlaid resistor transducer 210 to compensate for the resistance changes in the overlaid resistor transducer 210. The DC bias current source 212 includes any suitable structure for providing a DC bias current.

Although FIG. 2 illustrates one example of a system 200 including an antenna 202 with an overlaid resistor loop transducer 210, various changes may be made to FIG. 2. For example, the antenna 202 could include any suitable number of antenna portions and transducers. Also, the use of an analog-to-digital converter 204 is optional, such as when the processing circuit 206 is arranged to process analog signals. In addition, the system 200 could include any suitable number of antennas, analog-to-digital converters, and processing devices.

FIG. 3 illustrates an example overlaid resistor loop transducer 300 in an antenna according to this disclosure. The overlaid resistor loop transducer 300 could, for example, be used as the overlaid resistor loop transducer 210 in the antenna 202 of FIG. 2. The embodiment of the overlaid resistor loop transducer 300 shown in FIG. 3 is for illustration only. Other embodiments of the overlaid resistor loop transducer 300 could be used without departing from the scope of this disclosure.

As shown in FIG. 3, the overlaid resistor loop transducer 300 includes two conductive paths 302-304. The conductive paths 302-304 represent different conductive structures that are coupled to different antenna portions in an antenna. The conductive paths 302-304 could, for example, be coupled to different antenna portions at ends 306a-306b of the conductive paths 302-304.

The conductive paths 302-304 are also substantially overlaid. This means the conductive paths 302-304 overlap in, for example, the vertical direction with reference to a substrate carrying the conductive paths 302-304. The overlapped portions are represented as the cross-hatched area 308 in FIG. 3. In much of the overlapping area 308, the conductive paths 302-304 could be separated by a very small distance, such as 0.4 µm. At the end of the overlapping area 308, the conductive paths 302-304 may contact one another. This forms a junction 310 where the conductive paths 302-304 are electrically coupled together. This junction 310 may generally represent the area where much of the heat is generated by current flowing through the conductive paths 302-304.

Because the conductive paths 302-304 are located more closely together, the inductive impedance created in the overlaid resistor loop transducer 300 is much smaller compared to conventional resistor loop transducers. As a result, an antenna with the overlaid resistor loop transducer 300 may operate in a more efficient manner compared to conventional antennas. An example technique for forming an antenna with the overlaid resistor loop transducer 300 is shown in FIGS. 7A-1 through 7R-3, which are described below.

Although FIG. 3 illustrates one example of an overlaid resistor loop transducer 300 in an antenna, various changes may be made to FIG. 3. For example, while show as including generally straight segments, each of the conductive paths 302-304 could have any suitable size, shape, and configuration.

FIGS. 4A-1 through 4E-2 illustrate example antennas having overlaid resistor loop transducers according to this disclosure. The antennas and overlaid resistor loop transducers shown in FIGS. 4A-1 through 4E-2 are for illustration only. Other embodiments of the antennas and overlaid resistor loop transducers could be used without departing from the scope of this disclosure.

Figure 1:
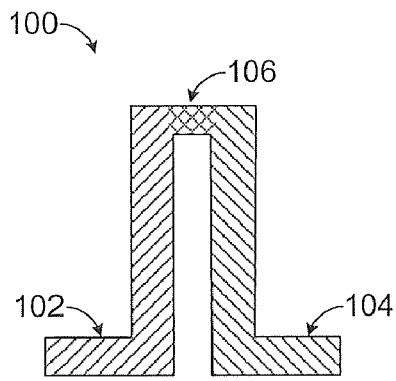
FIG. 1 illustrates a conventional planar resistor loop transducer in an antenna.
Figures 1, 4A:
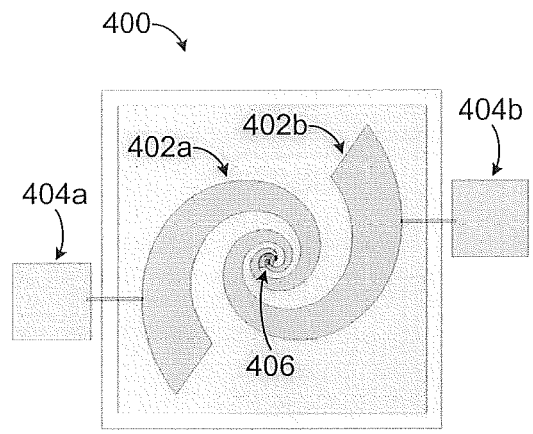
Figures 2, 4A:
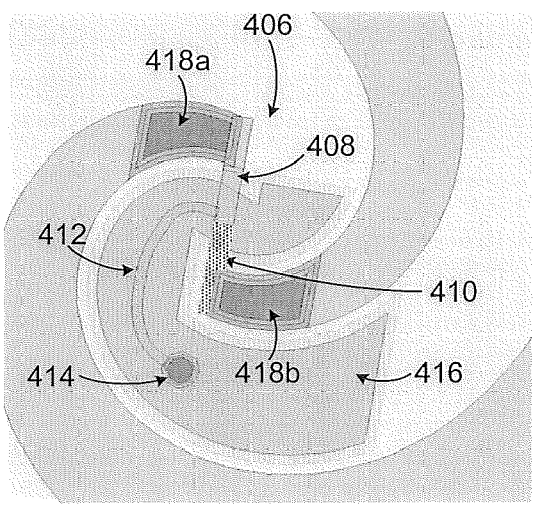

As shown in FIGS. 4A-1 and 4A-2, an antenna 400 includes two antenna portions 402a-402b. In the example shown in FIG. 4A-1, the antenna portions 402a-402b represent two spirals that are connected to two bonding pads 404a-404b. The bonding pads 404a-404b represent areas where electrical connections can be made between external elements (such as an analog-to-digital converter) and the antenna portions 402a-402b. The antenna portions 402a-402b are also coupled together by a transducer 406. The antenna portions 402a-402b could be formed from one or more suitable materials, such as one or more metals like gold or other conductive material(s). The bonding pads 404a-404b could also be formed from one or more suitable materials, such as one or more metals like gold or other conductive material(s). In particular embodiments, each of the antenna portions 402a-402b represents a spiral of 650 µm in total length, and the transducer 406 represents a thermionic emission (TE) element that is 40 µm in length.

One example embodiment of the transducer 406 is shown in FIG. 4A-2. Here, the transducer 406 includes two conductive paths 408-410, which are electrically coupled to the antenna portions 402a-402b. The conductive paths 408-410 also overlap in an area 412. In this example, the segments of the conductive paths 408-410 in the overlapping area 412 are curved and approximately form semi-circular structures. The overlapping area 412 represents an area where the two conductive paths 408-410 are separated by a very small distance (such as 0.4 µm) until the conductive paths 408-410 join or are electrically connected at a junction 414. The junction 414 represents a thermocouple, which is typically the hottest spot along the conductive paths 408-410. The conductive paths 408-410 could be formed from one or more suitable materials, such as one or more metals or other conductive material(s). The junction 414 represents any suitable interconnection between the conductive paths 408-410 and could be formed from one or more suitable materials, such as one or more metals or other conductive material(s).

In this example, much of the conductive paths 408-410 is encased in a sacrificial material 416. The sacrificial material 416 could include any suitable sacrificial material(s) that can be removed during subsequent fabrication steps. The sacrificial material 416 could, for example, represent silicon dioxide or aluminum.

Two junctions 418a-418b help to electrically connect the conductive paths 408-410 in the transducer 406 to the antenna portions 402a-402b. The junctions 418a-418b represent any suitable interconnections between the conductive paths 408-410 and the antenna portions 402a-402b, such as conductive vies. Also, the junctions 418a-418b could be formed from one or more suitable materials, such as one or more metals or other conductive material(s).

Various modifications could be made to the antenna 400 shown in FIGS. 4A-1 and 4A-2. For example, grid pads (capacitive checkerboard pads) could be used in place of the bond pads. Also, the antenna portions 402a-402b may or may not include terminations. In addition, the various sizes of the components in the antenna 400 could be adjusted. As particular examples, the antenna portions 402a-402b could have lengths of 500 µm, 650 µm, or 750 µm. As other particular examples, the transducer 406 could be 40 µm or 75 µm in length. The various shapes and dimensions of the components in the antenna 400 could be altered based on, among other things, the desired frequency to be received by the antenna 400. For instance, 500 µm antenna portion lengths could be used with a 1.5 terahertz peak, 650 µm antenna portion lengths could be used with a 650 gigahertz peak, and 750 µm antenna portion lengths could be used with a 500 gigahertz to 3 terahertz response.

Figures 1, 4B:
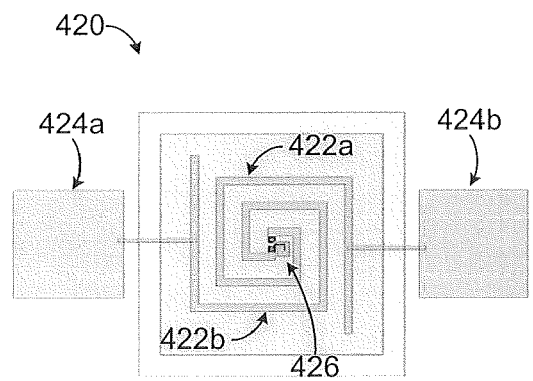
Figures 2, 4B:
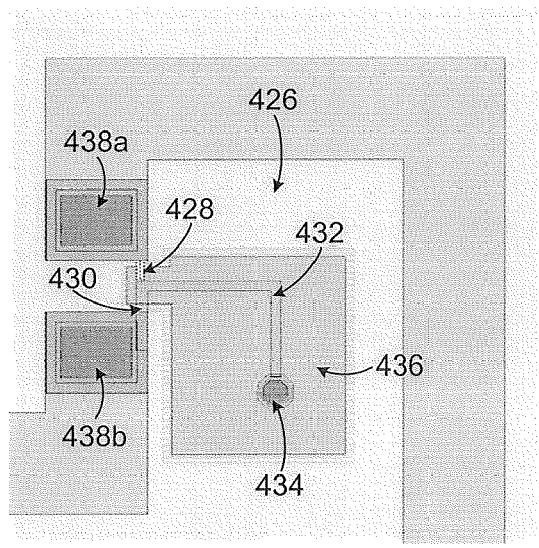

As shown in FIGS. 4B-1 and 4B-2, an antenna 420 includes many of the same or similar components as the antenna 400 of FIGS. 4A-1 and 4A-2. For example, the antenna 420 includes two antenna portions 422a-422b connected to two bonding pads 424a-424b. The antenna portions 422a-422b are also coupled together by a transducer 426. In this example, the antenna portions 422a-422b represent square spirals (as opposed to curved spirals in the antenna 400).

One example embodiment of the transducer 426 is shown in FIG. 4B-2. Here, the transducer 426 includes two conductive paths 428-430, which are electrically coupled to the antenna portions 422a-422b. The conductive paths 428-430 overlap in an area 432. In this example, the overlapping area 432 includes generally straight segments with approximately right angles. A junction 434 represents a thermocouple where the conductive paths 428-430 are electrically coupled. Much of the conductive paths 428-430 is encased in a sacrificial material 436. Two junctions 438a-438b help to electrically connect the conductive paths 428-430 in the transducer 426 to the antenna portions 422a-422b.

Various modifications could be made to the antenna 420 shown in FIGS. 4B-1 and 4B-2. For example, grid pads could be used in place of the bond pads. Also, the antenna portions 422a-422b may or may not include terminations. In addition, the various sizes of the components in the antenna 420 could be adjusted. As particular examples, the antenna portions 422a-422b could have lengths of 750 µm or other suitable length(s) As other particular examples, the transducer 426 could be 40 µm or 75 µm in length. The various shapes and dimensions of the components in the antenna 420 could be altered based on, among other things, the desired frequency to be received by the antenna 420.

Figures 1, 4C:
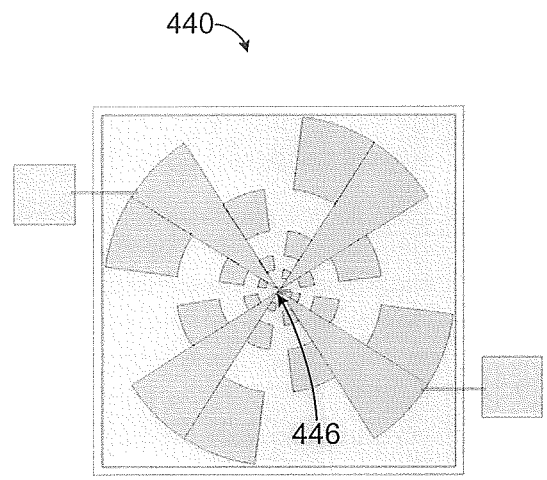
Figures 2, 4C:
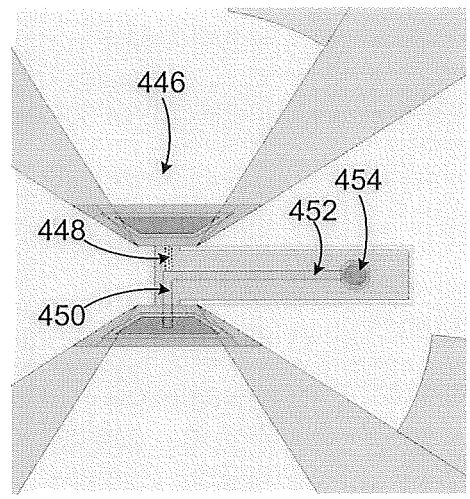

FIGS. 4C-1 and 4C-2 illustrate an antenna 440 having a four-piece logarithmic antenna design. A transducer 446 connects the various portions of the antenna 440 together. The transducer 446 includes conductive paths 448-450, which have an overlapping area 452 and a junction 454. The overlapping area 452 includes straight segments of the conductive paths 448-450. Various modifications could be made to the antenna 440 shown in FIGS. 4C-1 and 4C-2. For example, grid pads could be used in place of the bond pads. Also, the antenna portions may or may not include terminations. In addition, the various sizes of the components in the antenna 440 could be adjusted. As particular examples, the transducer 446 could be 40 µm or 75 µm in length. The various shapes and dimensions of the components in the antenna 440 could be altered based on, among other things, the desired frequency to be received by the antenna 440.

Figures 1, 4D:
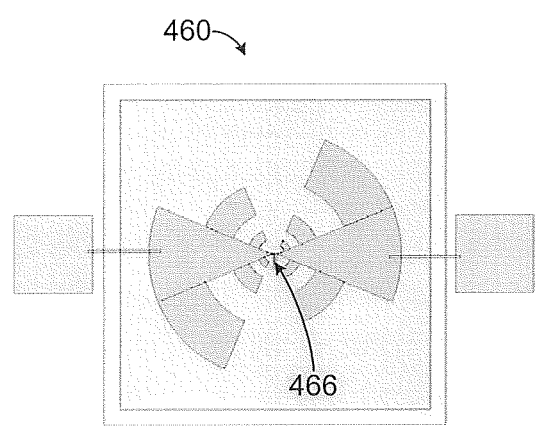
Figures 2, 4D:
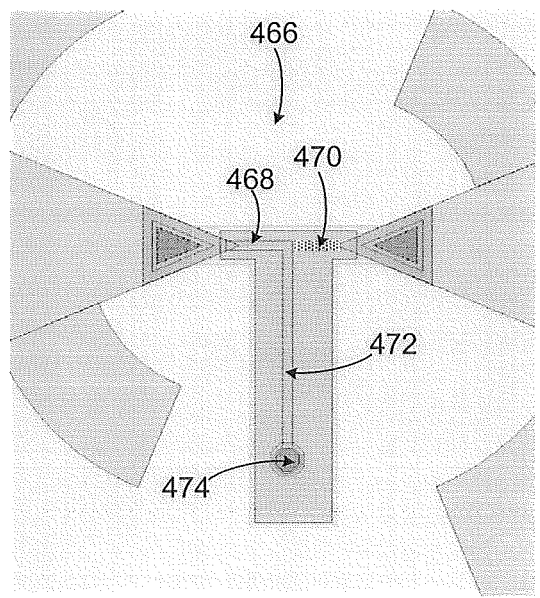

FIGS. 4D-1 and 4D-2 illustrate an antenna 460 having a two-piece logarithmic antenna design. A transducer 466 connects the various portions of the antenna 460 together. The transducer 466 includes conductive paths 468-470, which have an overlapping area 472 and a junction 474. The overlapping area 472 includes straight segments of the conductive paths 468-470. Various modifications could be made to the antenna 460 shown in FIGS. 4D-1 and 4D-2. For example, grid pads could be used in place of the bond pads. Also, the antenna portions may or may not include terminations. In addition, the various sizes of the components in the antenna 460 could be adjusted. As particular examples, the transducer 466 could be 40 µm or 75 µm in length. As another example, the upper and lower legs could be edge-to-edge, coincident, or offset by a specified distance (such as by 1 µm). The various shapes and dimensions of the components in the antenna 460 could be altered based on, among other things, the desired frequency to be received by the antenna 460.

Figures 1, 4E:
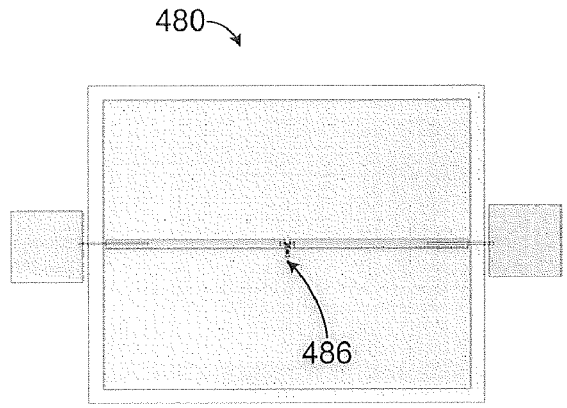
Figures 2, 4E:
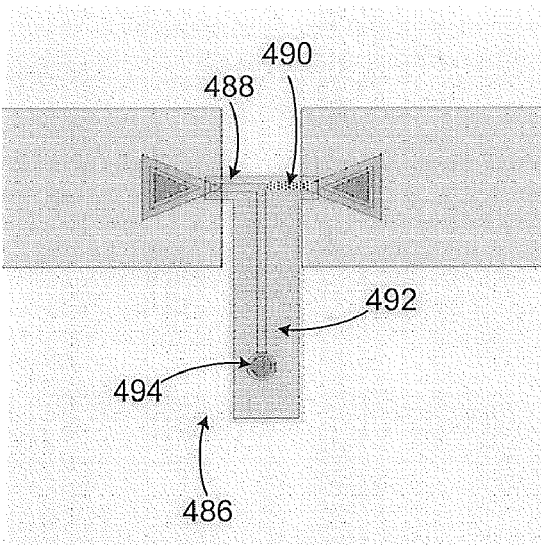

FIGS. 4E-1 and 4E-2 illustrate an antenna 480 having a dipole antenna design. A transducer 486 connects the various portions of the antenna 480 together. The transducer 486 includes conductive paths 488-490, which have an overlapping area 492 and a junction 494. The overlapping area 492 includes straight segments of the conductive paths 488-490. Various modifications could be made to the antenna 480 shown in FIGS. 4E-1 and 4E-2. For example, grid pads could be used in place of the bond pads. Also, the antenna portions may or may not include terminations. In addition, the various sizes of the components in the antenna 480 could be adjusted. As particular examples, the antenna portions could have a length of 750 µm or other suitable length(s). As other particular examples, the transducer 486 could be 40 µm or 75 µm in length. The various shapes and dimensions of the components in the antenna 480 could be altered based on, among other things, the desired frequency to be received by the antenna 480.

In these antennas, the antenna portions collect energy associated with radiation from wireless signals. The antenna portions generate currents, which are converted into DC voltages by the transducers. The DC voltages could then be measured or used by external components, thereby allowing the voltages to be analyzed and used in any suitable manner. Moreover, the conductive paths in the transducers are at least partially overlapping along a substantial portion of the conductive paths (such as at least half of the length of the conductive paths or more). This overlap is generally in a direction perpendicular to the plane in which the antenna portions are located.

Although FIGS. 4A-1 through 4E-2 illustrate examples of antennas having overlaid resistor loop transducers, various changes may be made to FIGS. 4A-1 through 4E-2. For example, the various shapes, sizes, and dimensions could be altered according to particular needs, such as to target specific frequencies for reception. Also, the designs shown here are for illustration only. Other antennas having any other suitable antenna portions or transducers could be used.

Figure 5:
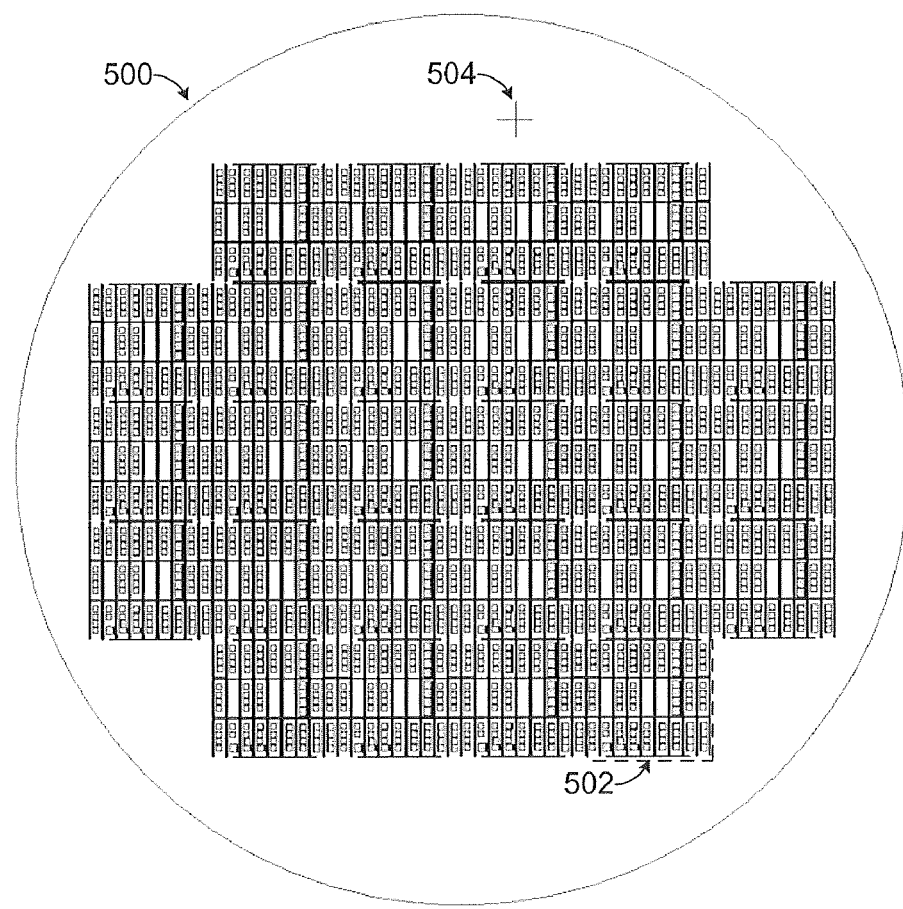
FIGS. 5 and 6 illustrate example details of a semiconductor wafer having antennas with overlaid resistor loop transducers according to this disclosure.
Figure 6:
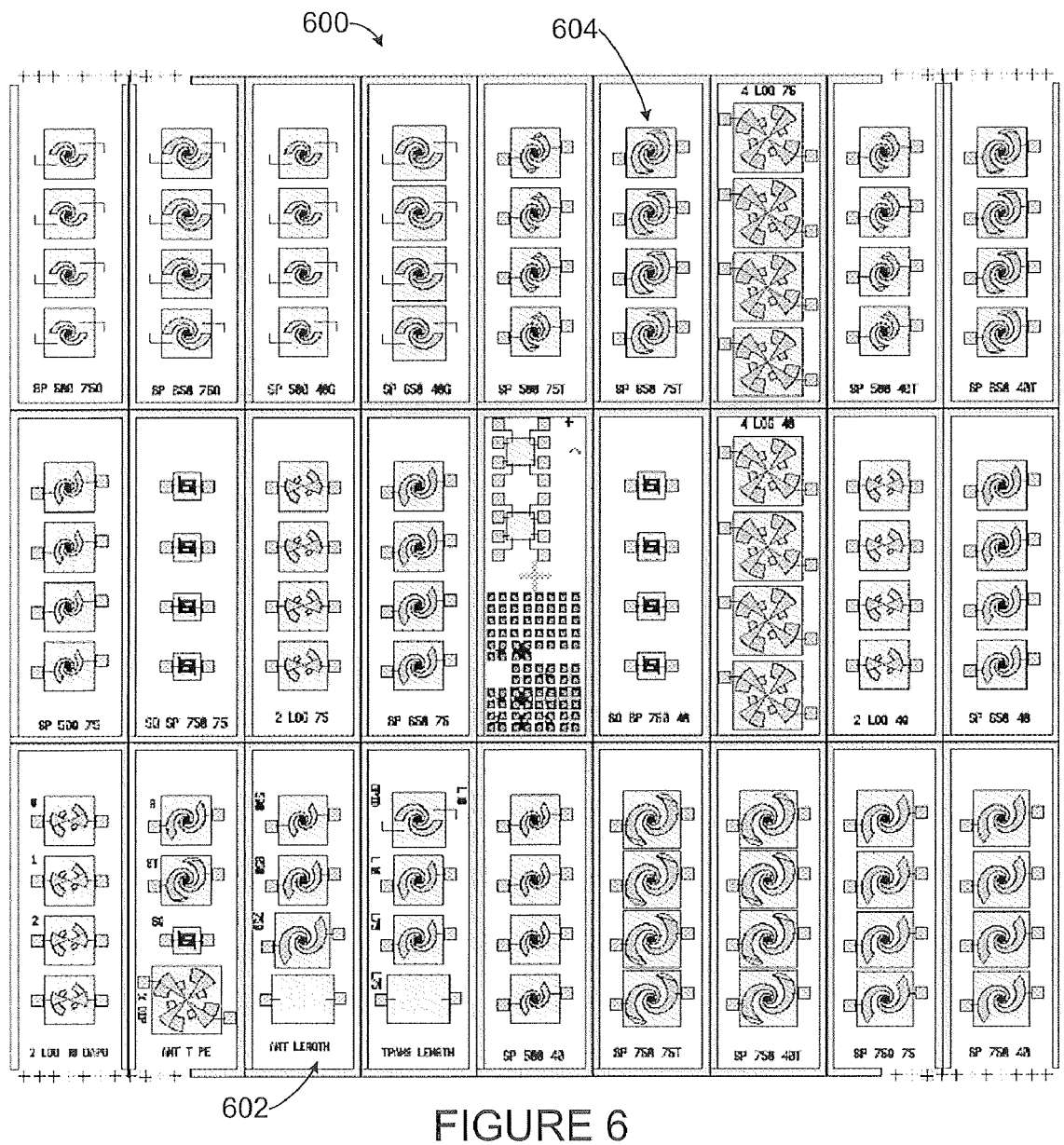

FIGS. 5 and 6 illustrate example details of a semiconductor wafer having antennas with overlaid resistor loop transducers according to this disclosure. The embodiment of the semiconductor wafer shown in FIGS. 5 and 6 is for illustration only. Other embodiments of the semiconductor wafer could be used without departing from the scope of this disclosure.

A semiconductor wafer 500 in FIG. 5 includes twenty six sections 502, where each section 502 is formed using a reticule 600 in FIG. 6. As shown in FIG. 5, the sections 502 are arranged into rows, each row including multiple sections 502. The semiconductor wafer 500 also includes an optical alignment target (OAT) 504, which is used for alignment purposes.

In some embodiments, the sizes of the structures in the sections 502 may be small enough to require the use of a stepper device during fabrication. The stepper generally processes one section 502 or a subset of sections 502 and then proceeds to the next section 502 or subset. This may allow smaller structures to be formed in the sections 502. In particular embodiments, the stepper uses two plates to form the sections 502. The plates include ten total fields (eight having primary data for masks, one having the OAT marker, and a blank field for clearing material at the edges of the wafer). Each plate could be five inches by three inches, and the working area of each plate could be five inches by one inch. Different marks could be used on the plates for alignment purposes, such as HAM and RAF marks.

As shown in FIG. 6, the reticule 600 can be used to form three rows of nine dies 602 in each of the sections 502. Many of the dies 602 define arrays of four pixel antennas 604. The pixel antennas 604 include different designs, including spiral, square spiral, logarithmic, and dipole antennas. These pixel antennas 604 therefore include the various designs shown in FIGS. 4A-1 through 4E-2 as described above. Also, the pixel antennas 604 have different forms, such as different transducer lengths (40 µm and 75 µm), antenna lengths (500 µm, 650 µm, and 750 µm), and connection types (simple, tapered termination, and grid-pad). Four of the dies 602 define structures that can be used for quick screening tests, where each of the four dies includes detectors of different types.

The center die 602 in the reticule 600 defines various diagnostic components. These diagnostic components can be formed during fabrication and then used to test the other components formed on the wafer 500. These diagnostic components can be used, for instance, to verify that the fabrication process was performed properly or within specifications. The diagnostic components could include any suitable components. For example, the diagnostic components could include cross bridge patterns for multiple metal layers used in the thermionic emission elements and the pad elements. There may also be contact strings between these metal layers. Eight different transducers that are heat-sunk can be provided, four-wire resistance measurements of each type of transducer junction can be taken, and those same eight transducers with no antennas connected can include two wires for other resistance measurements.

The reticule 600 could have any suitable size, such as a 13.95 millimeter width and a 13.35 millimeter height. Also, HAM markers can be included in the upper corners of the reticule 600, and the "streets" in the corners of the reticule 600 can be removed so that they do not interfere with the HAM markers.

In the technique described below, the first step in the process of FIGS. 7A-1 through 7R-3 to use the stepper (and the reticule 600) is the second mask step in the process. During this step second mask step, four marks (such as 2 µm marks) could be printed in each of the vertical and horizontal streets shown in FIG. 6. These marks can be used for alignment during later process steps.

Although FIGS. 5 and 6 illustrate example details of a specific semiconductor wafer having antennas with overlaid resistor loop transducers, various changes may be made to FIGS. 5 and 6. For example, the semiconductor wafer 500 could include any number of sections 502. Also, the use of a stepper may not be required if for instance, the structures on the semiconductor wafer 500 can be formed without its use. In addition, the reticule 600 could include any number of dies, and each die could include any suitable number and type of antennas.

FIGS. 7A-1 through 7R-3 illustrate an example technique for forming an antenna with an overlaid resistor loop transducer according to this disclosure. The embodiment of the technique shown in FIGS. 7A-1 through 7R-3 is for illustration only. Other techniques could be used without departing from the scope of this disclosure.

In these figures, the figures numbered "-1" represent views of an overlaid resistor loop transducer down the length of the transducer. Also, the figures numbered "-2" represent cross sections of the overlaid resistor loop transducer in the area where the transducer attaches to antenna portions of an antenna. In addition, the figures numbered "-3" generally represent plan or composite views of the upper surface of the overlaid resistor loop transducer.

In FIGS. 7A-1 and 7A-2, a substrate 702 is provided. The substrate 702 represents any suitable semiconductor substrate, such as a silicon substrate. An oxide layer 704 is formed over the substrate 702. The oxide layer 704 could be formed in any suitable manner and from any suitable material(s), such as by depositing an oxide on the substrate 702 or by oxidizing a portion of the substrate 702. The oxide layer 704 could, for example, represent an 8,000 Å layer of thermal silicon dioxide ($SiO_2$).

In FIGS. 7B-1 and 7B-2, an etch stop 706 is formed over the oxide layer 704. The etch stop 706 is used during later steps to control an etch of the substrate 702. The etch stop 706 could be formed in any suitable manner and from any suitable material(s). The etch stop 706 could, for example, represent a 2,000 Å layer of titanium tungsten (TiW). The formation of the etch stop 706 may involve a first mask step in the fabrication technique.

In FIGS. 7C-1 through 7D-2, a lower thermionic emission junction 708 is formed over the etch stop 706. In FIGS. 7C-1 and 7C-2, a silicon nitride ($Si_3N_4$) layer 710 is formed over the etch stop 706. The silicon nitride layer 710 could be formed in any suitable manner. The silicon nitride layer 710 could, for example, represent a 1,000 Å layer of silicon nitride. In FIGS. 7D-1 and 7D-2, a nickel-iron (NiFe) layer 712 is formed over the silicon nitride layer 710, and a silicon nitride layer 714 is formed over the nickel-iron layer 712. The nickel-iron layer 712 and the silicon nitride layer 714 could be formed in any suitable manner. The nickel-iron layer 712 could, for example, represent a 1,000 Å layer of 60% nickel and 40% iron. The silicon nitride layer 714 could, for example, represent a 1,000 Å layer of silicon nitride.

Etches are then performed to form the structures shown in FIGS. 7E-1 through 7E-3. For example, a plasma etch could be used to etch through the silicon nitride layer 714, an ion etch could be used to etch through the nickel-iron layer 712, and a plasma etch could be used to etch through the silicon nitride layer 710. This may involve a second mask step in the fabrication technique, and this may be the first mask step involving the use of a stepper (such as with a 1 µm line size).

In FIGS. 7F-1 through 7F-3, a sacrificial layer 716 is formed over the structure. The sacrificial layer 716 could be formed in any suitable manner and using any suitable material(s). The sacrificial layer 716 could, for example, represent a 4,000 Å layer of aluminum. An etch could then be performed to etch through the sacrificial layer 716 and form vias 718. This etch could, for instance, represent a wet etch that form vias 418 with sloped sidewalls. This may involve a third mask step in the fabrication technique (and the second mask step involving the use of the stepper).

In FIGS. 7G-1 through 7I-3, an upper thermionic emission junction 720 is formed over the sacrificial layer 716. In FIGS. 7G-1 through 7G-3, a silicon nitride layer 722 is formed over the sacrificial layer 716. The silicon nitride layer 720 could be formed in any suitable manner. The silicon nitride layer 720 could, for example, represent a 1,000 Å layer of silicon nitride. In FIGS. 7H-1 through 7H-3, an etch is performed to form vias 724 through the silicon nitride layer 722, the sacrificial layer 716, and the silicon nitride layer 714. This etch could, for instance, represent a plasma etch. This may involve a fourth mask step in the fabrication technique (and the third mask step involving the use of the stepper). In FIGS. 7I-1 through 7I-3, a conductive layer 726 is formed over the silicon nitride layer 722, and a silicon nitride layer 728 is formed over the conductive layer 726. The conductive layer 726 and the silicon nitride layer 728 could be formed in any suitable manner. The conductive layer 726 could, for example, represent a 900 Å layer of chromium. The silicon nitride layer 728 could, for example, represent a 1,000 Å layer of silicon nitride.

Etches are then performed to form the structures shown in FIGS. 7J-1 through 7J-3. For example, a plasma etch could be used to etch through the silicon nitride layer 728, an ion etch could be used to etch through the chromium layer 726, and a plasma etch could be used to etch through the silicon nitride layer 722. This may involve a fifth mask step in the fabrication technique (and the fourth mask step involving the use of the stepper).

In FIGS. 7K-1 through 7K-3, an upper etch stop/sacrificial layer 730 is formed over the structure. The etch stop/sacrificial layer 730 could be formed in any suitable manner and using any suitable material(s). The etch stop/sacrificial layer 730 could, for example, represent a 2,000 Å layer of aluminum. An etch is then performed to form the structures shown in FIGS. 7L-1 through 7L-3. This etch could represent a wet etch that etches through the etch stop/sacrificial layer 730 and generally forms an isolated transducer. This may involve a sixth mask step in the fabrication technique (and the fifth mask step involving the use of the stepper).

In FIGS. 7M-1 through 7M-3, an oxide layer 732 is formed over the isolated transducer. The oxide layer 732 could be formed in any suitable and from any suitable material(s). The oxide layer 732 could, for example, represent a 2 µm layer of tetraethylorthosilicate (TEOS). In FIGS. 7N-1 through 7N-3, an etch is performed to form a contact via 734 through the oxide layer 732. The etch could represent a plasma etch used to etch through the oxide layer 732 and the silicon nitride layer 714. This may involve a seventh mask step in the fabrication technique (and the sixth mask step involving the use of the stepper).

In FIGS. 7O-1 through 7O-3, a metal layer 736 is deposited to form multiple antenna portions and bonding pads. The metal layer 736 could be formed in any suitable manner and using any suitable material(s). The metal layer 736 could, for example, represent a layer of gold. In particular embodiments, the metal layer 736 could be formed using a lift-off photo technique to form a patterned layer of gold or other conductive material(s). This may involve an eighth mask step in the fabrication technique (and the seventh mask step involving the use of the stepper). At this point, the circuit being formed may have the structure shown in FIGS. 7P-1 through 7P-3. As can be seen in FIG. 7P-3, a transducer with overlapping conductive paths coupling multiple antenna portions has been created.

In FIGS. 7Q-1 and 7Q-2, etches are performed to etch through the substrate 702 and the oxide layer 704. This forms an opening 738 in the substrate 702. The etches could include a deep reactive ion etch (DRIE) to etch through the substrate 702 and an ion etch to etch through the oxide layer 704. The etch stop 706 can protect the formed transducer during these etches. This may involve a ninth mask step in the fabrication technique.

In FIGS. 7R-1 through 7R-3, an etch of the sacrificial layers is performed to complete the fabrication of the antenna. This etch can remove the sacrificial layer 716 and the etch stop/sacrificial layer 730. This etch also etches through the etch stop 706. This step may or may not involve the use of a vacuum dry. This produces a completed antenna having a transducer with overlapping conductive paths.

Although FIGS. 7A-1 through 7R-3 illustrate one example of a technique for forming an antenna with an overlaid resistor loop transducer, various changes may be made to FIGS. 7A-1 through 7R-3. For example, any other or additional steps could be used to form the structures shown in FIG. 7A-1 through 7R-3. Also, an overlaid resistor loop transducer could have any other suitable structure and could be formed using appropriate steps.

Figure 8:
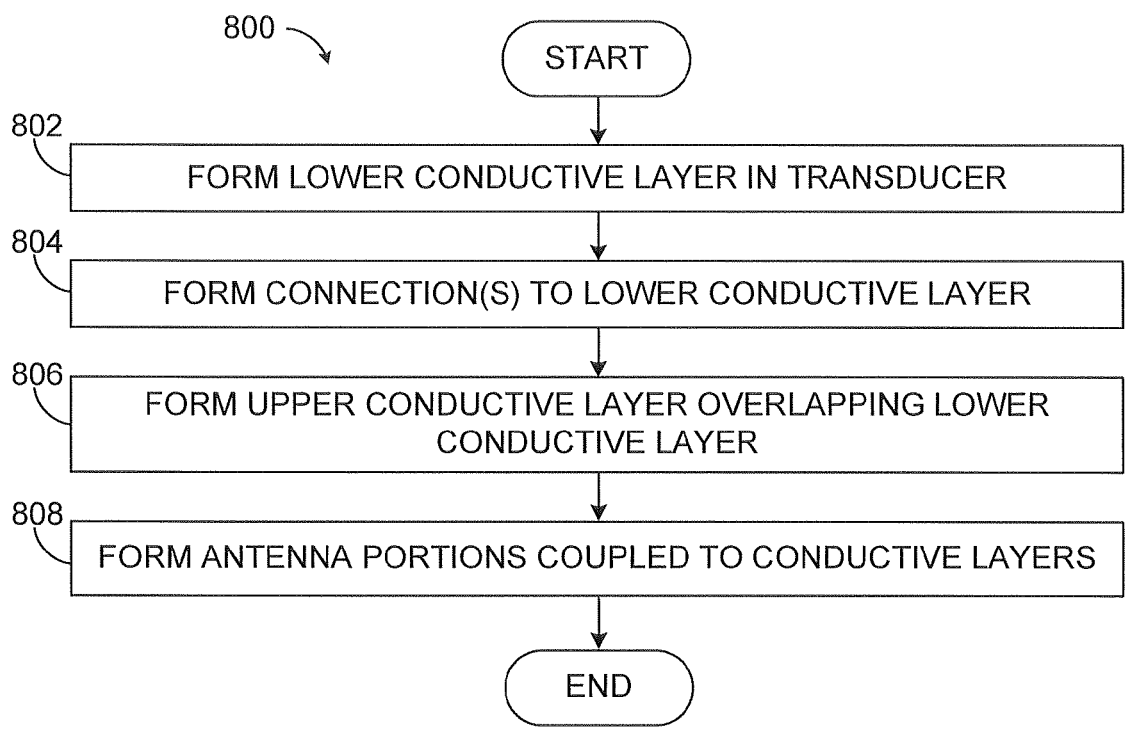
FIG. 8 illustrates an example method for forming an antenna with an overlaid resistor loop transducer according to this disclosure.

FIG. 8 illustrates an example method 800 for forming an antenna with an overlaid resistor loop transducer according to this disclosure. The embodiment of the method 800 shown in FIG. 8 is for illustration only. Other embodiments of the method 800 could be used without departing from the scope of this disclosure.

A lower conductive layer of a transducer is formed at step 802. This could include, for example, forming a nickel-iron layer with silicon nitride layers on top and bottom of the nickel-iron layer over a semiconductor substrate. The material(s) in the lower conductive layer could be deposited or otherwise formed in any suitable manner.

One or more connections to the lower conductive layer are formed at step 804. This could include, for example, forming one or more layers over the lower conductive layer of the transducer. This may also include etching one or more vias through the layer(s) above the lower conductive layer of the transducer. The one or more vias may be etched through to the nickel-iron layer. This may further include filling the via(s) with one or more conductive materials.

An upper conductive layer overlapping the lower conductive layer of the transducer is formed at step 806. This could include, for example, forming a chromium layer with silicon nitride layers on top and bottom of the chromium layer. The chromium layer is formed at least partially over the lower conductive layer. The material(s) in the upper conductive layer could be deposited or otherwise formed in any suitable manner. Also, the upper conductive layer can be electrically coupled to the lower conductive layer through the one or more connections.

Antenna portions coupled to the conductive layers are formed at step 808. This could include, for example, depositing gold or other conductive material(s) to form multiple antenna portions. The antenna portions could form any suitable type of antenna, such as a spiral, square spiral, logarithmic, or dipole antenna. In this way, an antenna can be formed having a transducer with overlapping conductive paths. The antenna could have better operating characteristics at higher frequencies since the inductive impedance of the transducer is reduced.

Although FIG. 8 illustrates one example of a method 800 for forming an antenna with an overlaid resistor loop transducer, various changes may be made to FIG. 8. For example, while shown as a sequence of steps, various steps in FIG. 8 could overlap or occur in parallel. As a particular example, the connection(s) formed at step 804 could be fabricated at the same time as the upper conductive layer of the transducer at step 806. This could occur, for instance, when conductive material such as chromium is deposited to form the connection(s) and the upper conductive layer.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   an antenna comprising multiple conductive portions; and
   a transducer electrically coupling the conductive portions of the antenna, the transducer comprising:
      a first conductive path electrically coupled to one of the conductive portions; and
      a second conductive path electrically coupled to the first conductive path and to another of the conductive portions;
   wherein the first and second conductive paths at least partially overlap along at least a substantial portion of their lengths, the overlap occurring in a direction perpendicular to a plane of the antenna portions.

2. The apparatus of claim 1, wherein the first and second conductive paths comprise curved segments that at least partially overlap.

3. The apparatus of claim 1, wherein the first and second conductive paths comprise one or more straight segments that at least partially overlap.

4. The apparatus of claim 1, wherein:
the first conductive path comprises nickel-iron; and
the second conductive path comprises chromium.

5. The apparatus of claim 1, further comprising:
a junction electrically coupling the first and second conductive paths, the junction comprising one or more materials forming the second conductive layer.

6. The apparatus of claim 1, wherein each of the conductive portions comprises a portion of one of: a spiral antenna, a square spiral antenna, a logarithmic antenna, and a dipole antenna.

7. The apparatus of claim 1, further comprising:
bonding pads coupled to the conductive portions of the antenna.

8. A method comprising:
forming a first conductive path over a semiconductor substrate;
forming a second conductive path electrically coupled to the first conductive path; and
forming multiple antenna portions, the first conductive path coupled to one of the antenna portions, the second conductive path coupled to another of the antenna portions;
wherein the first and second conductive paths at least partially overlap along at least a substantial portion of their lengths, the overlap occurring in a direction perpendicular to a plane of the antenna portions.

9. The method of claim 8, wherein forming the first conductive path comprises:
forming a first silicon nitride layer over the substrate;
forming a conductive layer over the first silicon nitride layer;
forming a second silicon nitride layer over the conductive layer; and
etching the first silicon nitride layer, the conductive layer, and the second silicon nitride layer.

10. The method of claim 9, wherein forming the second conductive path comprises:
forming a sacrificial layer over the first conductive path;
forming a third silicon nitride layer over the sacrificial layer;
etching a via through the third silicon nitride layer, the sacrificial layer, and the second silicon nitride layer;
forming a second conductive layer over the third silicon nitride layer and in the via; and
forming a fourth silicon nitride layer over the second conductive layer.

11. The method of claim 10, further comprising:
etching the fourth silicon nitride layer, the second conductive layer, and the third silicon nitride layer.

12. The method of claim 10, wherein forming the antenna portions comprises:
forming a second sacrificial layer over the second conductive path;
etching the first and second sacrificial layers;
forming an oxide layer over the substrate and the second sacrificial layer;
etching a contact via through the oxide layer and the second silicon nitride layer; and
forming a third conductive layer over the oxide layer, the third conductive layer comprising the antenna portions.

13. The method of claim 12, further comprising:
forming an etch stop on the substrate before forming the first conductive path; and
etching through the substrate to the etch stop after forming of the antenna portions.

14. The method of claim 13, further comprising:
etching the first and second sacrificial layers.

15. The method of claim 8, wherein forming the first and second conductive paths and the antenna portions comprise using a stepper.

16. A system comprising:
an antenna configured to receive wireless signals and to generate voltages based on the wireless signals; and
a processing circuit configured to process the voltages or information associated with the voltages;
wherein the antenna comprises:
multiple conductive portions; and
a transducer electrically coupling the conductive portions of the antenna, the transducer comprising (i) a first conductive path electrically coupled to one of the conductive portions and (ii) a second conductive path electrically coupled to the first conductive path and to another of the conductive portions;
wherein the first and second conductive paths at least partially overlap along at least a substantial portion of their lengths, the overlap occurring in a direction perpendicular to a plane of the antenna portions.

17. The system of claim 16, further comprising:
a signal conditioning circuit configured to condition the voltages from the antenna; and
an analog-to-digital converter configured to convert the conditioned voltages into digital values and to provide the digital values to the processing circuit.

18. The system of claim 16, wherein the antenna further comprises a junction electrically coupling the first and second conductive paths, the junction comprising one or more materials forming the second conductive layer.

19. The system of claim 16, wherein the antenna comprises one of multiple antennas.

20. The system of claim 16, wherein each of the conductive portions comprises a portion of one of: a spiral antenna, a square spiral antenna, a logarithmic antenna, and a dipole antenna.

* * * * *